(12) United States Patent
Brückner et al.

(10) Patent No.: US 12,225,744 B2
(45) Date of Patent: Feb. 11, 2025

(54) HYBRID MULTISPECTRAL DEVICE

(71) Applicant: SENORICS GMBH, Dresden (DE)

(72) Inventors: Robert Brückner, Freital (DE); Matthias Jahnel, Dresden (DE); Karl Leo, Dresden (DE); Ronny Timmreck, Dresden (DE)

(73) Assignee: SENORICS GMBH, Dresden (DE)

( * ) Notice: Subject to any disclaimer, the term of this patent is extended or adjusted under 35 U.S.C. 154(b) by 723 days.

(21) Appl. No.: 17/310,229

(22) PCT Filed: Jan. 8, 2020

(86) PCT No.: PCT/EP2020/050284
§ 371 (c)(1),
(2) Date: Jul. 27, 2021

(87) PCT Pub. No.: WO2020/156767
PCT Pub. Date: Aug. 6, 2020

(65) Prior Publication Data
US 2022/0165798 A1    May 26, 2022

(30) Foreign Application Priority Data
Jan. 29, 2019    (DE) .................... 10 2019 102 176.6

(51) Int. Cl.
*H01L 27/30* (2006.01)
*G01J 3/28* (2006.01)
*H10K 39/32* (2023.01)

(52) U.S. Cl.
CPC ............ *H10K 39/32* (2023.02); *G01J 3/2823* (2013.01); *G01J 2003/2826* (2013.01)

(58) Field of Classification Search
CPC . H10K 39/32; G01J 3/2823; G01J 2003/2826
See application file for complete search history.

(56) References Cited

U.S. PATENT DOCUMENTS 7,847,362 B2 * 12/2010 Ogino ............... H01L 27/14601
257/443
2003/0209651 A1    11/2003 Iwasaki
2018/0182811 A1    6/2018 Richter et al.

FOREIGN PATENT DOCUMENTS

DE    10 2015 109 044 A1    12/2016
EP         2509108 A1    10/2012
(Continued)

OTHER PUBLICATIONS

International Search Report (and English translation) and Written Opinion of the International Searching Authority for International Application No. PCT/EP2020/050284 mailed on Mar. 13, 2020.

*Primary Examiner* — Peniel M Gumedzoe
(74) *Attorney, Agent, or Firm* — HESLIN ROTHENBERG FARLEY & MESITI P.C.

(57) ABSTRACT

The invention concerns a hybrid multispectral device comprising a substrate having a first surface and a second surface, at least one first functional element having a first functional layer operable to detect or emit light of a first wavelength range, and at least one second functional element having a second functional layer operable to detect or emit light of a second wavelength range different from the first wavelength range. The first functional element is arranged on the first surface of the substrate, while the second functional element is arranged on the second surface of the substrate. The first functional element is arranged in a first lateral region of the multispectral device, and the second functional element is arranged in a second lateral region of the multispectral device. The first lateral region and the second lateral region are arranged laterally offset from each other such that the light of the second wavelength region reaches the second functional element or the light of the second wavelength region emitted from the second functional element exits the multispectral device on the first (Continued)

surface of the substrate without having passed through the first functional layer.

13 Claims, 6 Drawing Sheets

(56) References Cited

FOREIGN PATENT DOCUMENTS

| | | |
|---|---|---|
| EP | 3057138 A1 | 8/2016 |
| JP | 2004-165242 A | 6/2004 |
| JP | 2013-515405 A | 5/2013 |
| JP | 2015-023259 A | 2/2015 |
| JP | 2015-037121 A | 2/2015 |
| JP | 2017-108062 A | 6/2017 |

* cited by examiner

HYBRID MULTISPECTRAL DEVICE

CROSS REFERENCE TO RELATED APPLICATIONS

This application is a national stage filing under section 371 of International Application No. PCT/EP2020/050284 filed on Jan. 8, 2020, and published on Aug. 6, 2020 as WO 2020/156767, which claims priority to German Application No. 10 2019 102 176.6, filed on Jan. 29, 2019. The entire contents of WO 2020/156767 are hereby incorporated herein by reference.

The invention concerns a hybrid multispectral device suitable for the detection and/or emission of light in different spectral ranges.

In order to be able to detect different spectral ranges of light, e.g. visible light, light in the infrared range and/or light in the UV range, with a photodetector device, devices with several sensors having different functional layers and thus detecting light from different spectral ranges are known. By way of example, DE 10 2015 109 044 A1 describes a component with a substrate on one side of which a first functional layer for detecting light of a first wavelength range and on the other side of which a second functional layer for detecting light of a second wavelength range are arranged. In this case, the individual functional layers always lie on top of each other, whereby a high degree of filling, i.e. a large number of sensor elements per area, can be achieved. The first functional layer and the substrate are transparent to light in the second wavelength range.

US 2003/0209651 A1 describes a color-sensitive device for detecting light of different wavelengths, in particular red, green and blue light in the visible range. The device has a first light-receiving part suitable for detecting light of a first wavelength range and a second light-receiving part suitable for detecting light of a second wavelength range. The first and second parts are arranged such that incident light passes through the first portion and is then received by the second portion. The central wavelength of the first wavelength range is greater than the central wavelength of the second wavelength range.

A disadvantage of this setup lies in the limited selection of wavelength ranges due to the materials of the functional layers and the substrate and the necessary transparency of the first functional layer and the substrate for light of the second wavelength range, as well as in the limited spectral resolution.

It is therefore an object of the present invention to provide a hybrid multispectral device that alleviates the disadvantages of the prior art.

The object is solved by a hybrid multispectral device according to claim 1. Preferred embodiments are given in dependent claims.

The hybrid multispectral device according to the invention comprises a substrate, at least one first functional element and at least one second functional element. The first functional element is arranged on a first surface of the substrate and comprises a first functional layer suitable for detecting or emitting light of a first wavelength range. The second functional element is arranged on a second surface of the substrate facing the first surface of the substrate and comprises a second functional layer operable to detect or emit light of a second wavelength range. The second wavelength range is different from the first wavelength range but may also partially overlap with the first wavelength range. In the context of the present invention, light is understood in both cases to mean electromagnetic radiation with a wavelength in the range between 250 nm (UV range) to about 10 µm (infrared range). The first wavelength range and the second wavelength range are each subranges of this range. Of course, the first functional element and the second functional element may also comprise other layers, e.g. electrode layers, in addition to the first and second functional layers, respectively. Furthermore, the first and/or the second functional layer can also be layer structures of several layers.

"Arranged on the surface" means that the functional element is directly adjacent to the respective surface, or that one or more layers of the functional element are formed entirely or partially in a substrate region adjacent to the surface. In addition, further layers may also be arranged between the functional element and the respective surface.

According to the invention, the first functional element is arranged in a first lateral region of the multispectral device, while the second functional element is arranged in a second lateral region of the multispectral device. In this case, the first lateral region and the second lateral region are arranged laterally offset from each other such that light of the second wavelength region reaches the second functional element without having passed through the first functional layer. In other words, light that reaches the second functional element has passed through the substrate and possibly existing further layers, which will be explained later, on its way to the second functional element, but not through the first functional layer and possibly existing further layers of the first functional element.

The substrate and, if applicable, further layers of the second functional element act as optical filters which reflect or absorb certain wavelength components of the incident light due to their optical properties, while other wavelength components lying in the second wavelength range are transmitted with little change or practically unchanged. This must be taken into account when selecting the substrate material and, if applicable, other layers located between the second functional layer and an emitting light source, as well as their thickness. Advantageously, however, the detection result of the second functional element or the light emitted by the second functional element is not influenced by the first functional layer as well as possibly existing further layers of the first functional element.

With the multispectral device according to the invention, components of light in two different wavelength ranges can be detected and/or emitted simultaneously and spectrally selectively, wherein the light which is detected in or emitted by the first and/or the second functional element respectively impinges on or exits the same side of the device. In this respect, there are the following possibilities for the design of the multispectral device according to the invention: the first functional element is an emitting element, and the second functional element is a detecting element; the first functional element is a detecting functional element, and the second functional element is an emitting element; the first and second functional elements are both detecting elements; the first and second functional elements are both emitting elements.

If at least the first or the second functional element is a detecting element, the light detected in this functional element can be emitted by one light source or by several different light sources, wherein, in the second case, the light of the different light sources can be superimposed or can impinge on the multispectral device successively in time. In the following, the term "light source" is used for short, even if several light sources are present. Also, the first functional element or the second functional element, which does not serve as a detecting element, can provide the light, if the corresponding functional element is designed as an emitting element, wherein the light to be detected is then reflected by a sample to be examined. In the further course, such a reflecting sample is to be understood as a light source, even if as such it does not generate any light at all, but only reflects it—in a modified or in an unmodified form. Such detecting devices can be used, for example, for the qualitative and quantitative determination of ingredients of food or other materials in the field of health care, pharmacy, food technology as well as plant or engine monitoring in an industrial environment.

All statements regarding the first functional element and/or the second functional element and/or the first lateral region and the second lateral region apply accordingly to all first functional elements and/or all second functional elements, if several such first and/or second functional elements are present.

Preferably, at least one optical filter layer is arranged on the first surface of the substrate and/or the second surface of the substrate in the second lateral region, i.e., between the second functional layer and, for example, the light source. This conduces to further control the wavelength range of the light incident on the second functional layer and preferably consists of one or more dielectric materials which are sufficiently transparent in the respective spectral range, such as, for example, organic materials, fluorides, silicon dioxide ($SiO_x$) or titanium dioxide ($TiO_x$), or of materials whose absorption properties can be used for optical filtering.

Alternatively or additionally, the second lateral region on the side of the first surface of the substrate is preferably surrounded by an optical aperture layer. This means that, for example, the layers of the first functional element arranged on the first surface of the substrate in the first lateral region are provided with an aperture layer on the side. However, the optical aperture layer may also be set aside or formed on the side of an optical filter layer that may be present in the second lateral region if a second lateral region is not adjacent to a first lateral region on at least one side. In this context, the aperture layer reduces an incidence of stray light, for example from the first functional layer of the first lateral region, into the second lateral region, or prevents it completely. The aperture layer consists, for example, of silver (Ag), aluminum (Al), tungsten or similar CMOS-compatible materials.

With both means, the spectral resolution of the second functional element can be improved. In addition, optical effects, in particular filter effects, of the substrate can be further specifically enhanced by a suitable material selection of the optical filter layer and the optical aperture layer, independent of the material of the first functional layer. Furthermore, these layers also serve to protect active integrated devices or circuit elements, which may be present in the substrate in lateral regions other than the second lateral regions, from unwanted stray light.

Preferably, a further layer is arranged on the first functional layer on the side facing away from the first surface of the substrate, which serves as an optical filter or as a mirror or as a DBR (distributed Bragg reflector, Bragg mirror). In this way, a defined wavelength range adapted to the first functional layer can be filtered out from the light incident from the light source or from the light emitted by the first functional layer, and the spectral resolution of the first functional element can be improved.

Preferably, the substrate comprises active integrated devices, such as transistors, or circuit elements which serve to process or forward the signals obtained from the first and/or the second functional element during the detection of light and/or to control the first and/or the second functional element in the case of light-emitting functional elements. In this context, circuit elements are to be understood as wirings and vias, but also passive devices, such as resistors. As a result, complex digital or analog circuits, e.g., in CMOS technology or in thin-film technology, can be formed in the substrate. In this context, the described devices or circuit elements are arranged within the substrate in one or more lateral regions that do not correspond to the second lateral region or contain parts thereof. In other words, the described elements are arranged outside the second lateral region, particularly preferably in the first lateral region.

Preferably, the substrate comprises a semiconductor layer. Particularly preferably, the substrate is a semiconductor substrate. The semiconductor layer or the semiconductor substrate preferably consists of monocrystalline or polycrystalline silicon, amorphous silicon, or indium gallium zinc oxide (IGZO). Preferably, the above-mentioned active integrated devices or circuit elements are at least partially formed in the semiconductor layer or the semiconductor substrate.

In embodiments of the invention, the substrate is a composite substrate and comprises multiple layers of one or different materials. For example, the substrate may comprise two semiconductor substrates interconnected by bonding, gluing or other suitable joining processes, or a semiconductor layer deposited on or connected to an insulator by suitable joining processes (silicon on insulator, SOI). In addition, contacts, devices and switching elements or circuits in different layers of the composite substrate can be interconnected by Through Silicon Via technology (TSV) and bonding. Materials for TSV interconnects include tantalum (Ta), tungsten (VV) and gold (Au). Of course, other materials, such as glass, plastics or plastic films, can also be used as a composite substrate or as one layer of the composite substrate.

Preferably, the first functional layer contains or consists of an inorganic layer. The inorganic layer can, for example, be a semiconductor layer, e.g., of silicon, aluminum gallium arsenide, gallium phosphide, silicon carbide, zinc selenide or indium gallium nitride. Thus, semiconductor photodiodes (detector) or semiconductor light emitting diodes (LED) known from the prior art can be used as first functional elements.

Preferably, the second functional layer contains or consists of an organic layer or a layer of a nanomaterial or a layer of quantum nanoparticles. Such functional layers are also known from the prior art and the corresponding functional elements are described as organic photodetectors or charge-transfer photodetectors (CT photodetectors), for example in EP 3 152 785 B1. Known organic light-emitting diodes (OLED) can be used as emitting functional elements. In addition to photoactive layers, further electronic components such as transistors or resistors can also be formed within the organic functional layer, which enable additional circuitry.

In embodiments of the hybrid multispectral device according to the invention, the substrate is formed as a composite substrate of a semiconductor substrate and a glass substrate or a plastic substrate, wherein the semiconductor substrate and the glass or plastic substrate are bonded to each other by means of a bond layer, an adhesive layer or another interconnecting layer. The first functional element is formed on or in the semiconductor substrate, wherein the first functional layer comprises an inorganic layer. The second functional element is formed on the glass or plastic substrate, wherein the second functional layer includes an organic layer or a layer of a nanomaterial or a layer of quantum nanoparticles.

It is understood that the substrate can also consist only of a semiconductor substrate, on one surface of which a thick insulator layer is deposited. In this case, the first functional element is formed on or in the semiconductor substrate, the first functional layer comprising an inorganic layer, while the second functional element is formed on the insulator layer, the second functional layer comprising an organic layer or a layer of a nanomaterial or a layer of quantum nanoparticles.

In addition to the first and the second functional element, the multispectral device according to the invention further comprises, in a preferred embodiment, at least a third functional element comprising a third functional layer. The third functional layer is suitable for detecting or emitting light of a third wavelength range which is different from the first and second wavelength ranges. The third functional element is disposed on the first surface of the substrate or on the second surface of the substrate in a lateral region different from the second lateral region.

Preferably, the third functional element is arranged in the first lateral region in such a way that the light of the third wavelength region reaches the third functional element or the light of the third wavelength region emitted by the third functional element leaves the multispectral device after it has passed through the first functional layer. In other words, the third functional element is arranged in the first lateral region on the side of the first functional element facing away from the light source or on the side facing the substrate. In this case, the first functional layer is transparent to light of the third wavelength range. It is of course not obligatory that third functional elements are formed in all first lateral regions of the multispectral device.

Alternatively or additionally, third functional elements with the third functional layer may also be formed in third lateral regions different from the first and second lateral regions, in which case the light incident on the third functional layer has not previously passed through the first functional layer or the light emitted from the third functional layer does not pass through the first functional layer before leaving the multispectral device.

In embodiments, at least the first functional element or the second functional element is suitable for detecting light and is present in a number greater than 1 in the multispectral device. Preferably, in this case, different first functional elements suitable for detecting light and/or different second functional elements suitable for detecting light are suitable for detecting light with wavelengths different from one another in the first or second wavelength range. Thus, a further spectral resolution of the first or second wavelength range can be achieved, wherein different first functional elements or different second functional elements can, for example, detect light with a bandwidth of less than or equal to 10 nm for different wavelengths in the UV range, in the visible range or in the infrared range. Such a detection of light in different sections of the first or the second wavelength range can be adjusted, for example, via the thickness of the respective functional layer or by limiting the lateral extent of the respective functional layer, which can be achieved, for example, by structuring, and is referred to as optical enclosing or optical encompassing. When limiting the lateral expansion, the expansion of the functional layer in one or more lateral directions, which run in a plane perpendicular to the thickness of the functional layer, is limited to a value in the order of magnitude of the wavelength of the light detected or emitted by the functional layer. A value between half the wavelength and 50 times the wavelength is considered to be of the order of the wavelength. For example, the lateral extent of the functional layer in a lateral direction for a wavelength of 1 µm to be detected or emitted can be in the range of 0.5 µm to 50 µm, but not in a range smaller than 0.5 µm or larger than 50 µm.

As already described, the multispectral device according to the invention preferably comprises a plurality of first functional elements and a plurality of second functional elements, i.e., a plurality of first lateral regions and a plurality of second lateral regions. In this case, the first lateral regions and the second lateral regions are arranged in a grid-like, line-like or concentrically distributed manner over the surface of the multispectral device.

Within the scope of the invention, the embodiments or individual features thereof may also be combined with each other to constitute the multispectral device, as long as they are not mutually exclusive.

The invention is explained in more detail below with reference to the figures. It is shown in.

Figure 1:
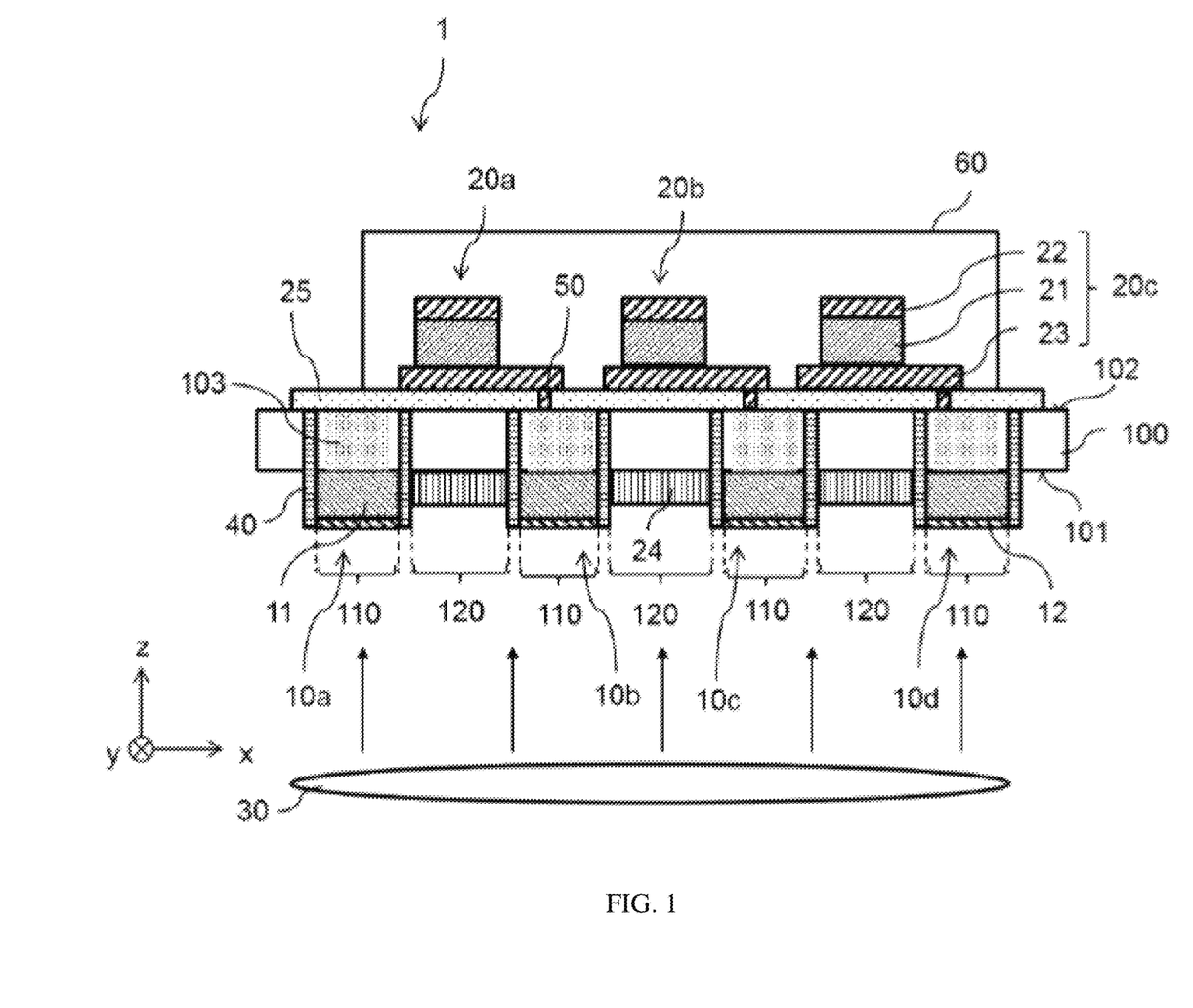
FIG. 1 a first embodiment of the multispectral device according to the invention with a semiconductor substrate in cross-section, FIG. 2 a second embodiment of the multispectral device according to the invention with a composite substrate in cross-section, FIG. 3 a third embodiment of the multispectral device according to the invention with a third functional element in cross-section, FIG. 4A to 4C various exemplary arrangements of the first and second functional elements in plan views of the first surface of the substrate and FIGS. 5A to 5D schematic views of possible embodiments of the multispectral device according to the invention with respect to detecting and emitting functional elements.

FIG. 1 shows a first embodiment 1 of the hybrid multispectral device according to the invention. The multispectral device contains, by way of example, four first functional elements 10a to 10d and three second functional elements 20a to 20c as well as a substrate 100. The substrate 100 has a first surface 101 and a second surface 102 which is opposite the first surface 101. The first functional elements 10a to 10d are disposed on the first surface 101, while the second functional elements 20a to 20c are disposed on the second surface 102. The first functional elements 10a to 10d have a first functional layer 11 suitable for detecting light in a first wavelength range $\lambda 1$, for example by photoelectric conversion. The second functional elements 20a to 20c have a second functional layer 21 which is suitable for detecting light in a second wavelength range $\lambda 2$ which is different from the first wavelength range $\lambda 1$. Here, too, the photoelectric conversion of energy can be used, for example. The first functional layer 11 can, for example, be a semiconductor layer, for example of silicon, which can detect light in the UV range or in the visible range, while the second functional layer 21 can, for example, be an organic layer which can detect light in the infrared range. The light, shown in FIG. 1 by the arrows, is emitted by a light source 30 or by different light sources and always impinges on the multispectral device 1 on the side of the multispectral device 1 adjacent to the first surface 101. On the side of the first functional layer 11 facing the incident light, i.e., the side which is not adjacent to the first surface 101 of the substrate 100, an optical functional layer can be arranged, which is, for example, a first DBR layer 12. This optical functional layer can be different for different first functional elements 10a to 10d and can implement different filter functions, so that, for example, in a first one of the first functional elements 10a only blue components of the incident light, i.e. light in the wavelength range 380 nm≤λ11≤490 nm, is detected, while in a second one of the first functional elements 10b only red components of the incident light, i.e. light in the wavelength range 585 nm≤λ12≤750 nm, is detected. Of course, other wavelength ranges can also be selected. The optical functional layer can be applied directly to one or more first functional elements 10a to 10d by means of known deposition processes. Alternatively, it is possible to arrange the optical functional layer for individual, several or all first functional elements on a separate substrate or to form it in the latter, the separate substrate then being joined to the first functional element or elements by means of a joining process, e.g. bonding or gluing.

In addition to the second functional layer 21, the second functional elements 20a to 20c have two electrode layers 22 and 23, one of which, the electrode 23, is arranged on the side of the second functional layer 21 facing the second surface 102 of the substrate 100 and is transparent to light in the second wavelength range λ2, while the other is arranged on the side of the second functional layer 21 facing away from the second surface 102 and can be opaque in the second wavelength range λ2.

According to the invention, the first functional elements 10a to 10d are arranged in first lateral regions 110 of the substrate 100, while the second functional elements 20a to 20c are arranged in second lateral regions 120 of the substrate 100 different from the first lateral regions 110. The first lateral regions 110 and the second lateral regions 120 do not overlap, so that the first functional elements 10a to 10d and the second functional elements 20a to 20c are arranged laterally offset from each other. This means that light arriving at the second functional elements 20a to 20c has not passed through the first functional layer 11. The first and second lateral regions 110 and 120 can have arbitrary shapes (contours) and arbitrary lateral sizes and can be distributed arbitrarily over the extent of the substrate 100 in the x-y direction, the shape and size being determined in each case in a top view of the first or second surface 101 or 102 of the substrate 100, i.e. in an x-y plane. The first and second lateral regions 110 and 120 thereby extend in their entirety over the entire extent of the multispectral device 1 perpendicular to the lateral extent of the substrate 100, i.e. along the z-direction, and may be laterally adjacent or spaced apart.

In the first embodiment 1 shown, integrated active components 103 are formed in the first lateral regions 110 in the substrate 100, which is, for example, a silicon-based semiconductor substrate. These serve, for example, to process signals from the first and/or second functional elements 10a to 10d or 20a to 20c or to control various functional elements.

In the second lateral regions 120, the substrate 100 is transparent for the incident light at least in the second wavelength range λ2. Therefore, no integrated active components 103 are formed there. However, a first filter layer 24 may be arranged on the first surface 101 in the second lateral regions 120, while a second filter layer 25 is arranged on the second surface 102 between the second surface 102 and the second functional elements 20a to 20c. The second filter layer 25 may also extend beyond the second lateral regions 120 and be arranged, for example, on the entire or almost the entire second surface 102. The first and second filter layers 24 and 25 are transparent to the incident light at least in partial regions of the second wavelength range λ2. It is understood that the first filter layer 24 and/or the second filter layer 25 may be configured differently in different second lateral regions 120, so that different portions of the second wavelength range λ2 may be detected in different second functional elements 20a to 20c. The second filter layer 25 also serves to electrically isolate the electrodes 23 from the substrate 100.

The second lateral regions 120 are surrounded on the side of the multispectral device 1 adjacent to the first surface 101 by an aperture layer 40 in the lateral direction, i.e., in all directions of the x-y plane, to reduce interference of the light incident on the second functional elements 20a to 20c by scattered light from, for example, the first lateral region 110. The aperture layer 40 may also extend through the substrate 100 to the second surface 102, as shown in FIG. 1. Furthermore, the aperture layer 40 may also completely surround the first lateral regions 110, i.e., the first functional elements 10a to 10d, the integrated active devices 103 and the first DBR layer 12, even on the sides where no second lateral region 120 is arranged. This reduces losses due to stray light in the first functional elements 10a to 10d.

The second functional elements 20a to 20c may each be connected to the integrated active components 103 via contacts 50, e.g. electrical vias, the contacts 50 each being adjacent to an electrode 23 and penetrating the second filter layer 25.

The second functional elements 20a to 20c are surrounded by a housing 60, which is adjacent to the second filter layer 25 or the second surface 102 of the substrate 100, and are separated from the surroundings. Alternatively, the second functional elements 20a to 20c may be protected against environmental influences by a coating of suitable encapsulating materials, such as thin films of glass or alternating thin film solutions of polymers and oxides or similar materials. The housing 60 is preferably made of glass or cavity glass, but may also be made of various films and polymers in thin film laminate.

Figure 2:
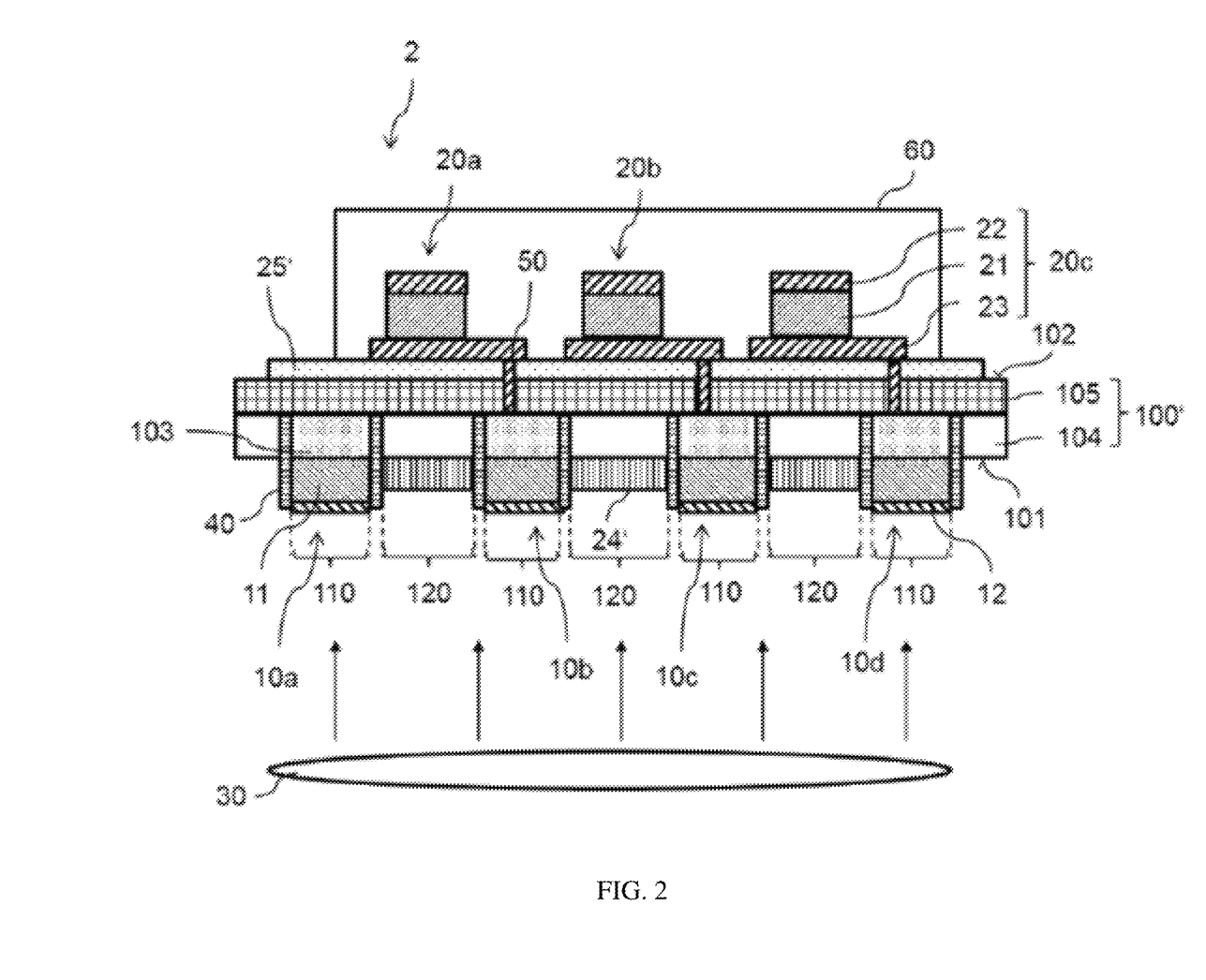

The second embodiment 2 of the multispectral device shown in FIG. 2 differs from the first embodiment 1 in that the substrate 100' is designed as a composite substrate consisting of a semiconductor substrate 104 and a glass substrate 105, which are bonded to each other by a bonding or gluing process. It is understood that another substrate, e.g. a plastic substrate, can also be used instead of the glass substrate 105. Since the optical properties of the substrate 100' are now different from those of the substrate 100, the first and second filter layers 24' and 25' may also differ from the corresponding filter layers 24 and 25 of the first embodiment 1 or may also be omitted, individually or together. The contacts 50 now also penetrate the glass substrate 105 to establish electrical contact between the electrodes 23 and the integrated electrical components 103 in the semiconductor substrate 104.

Figure 3:
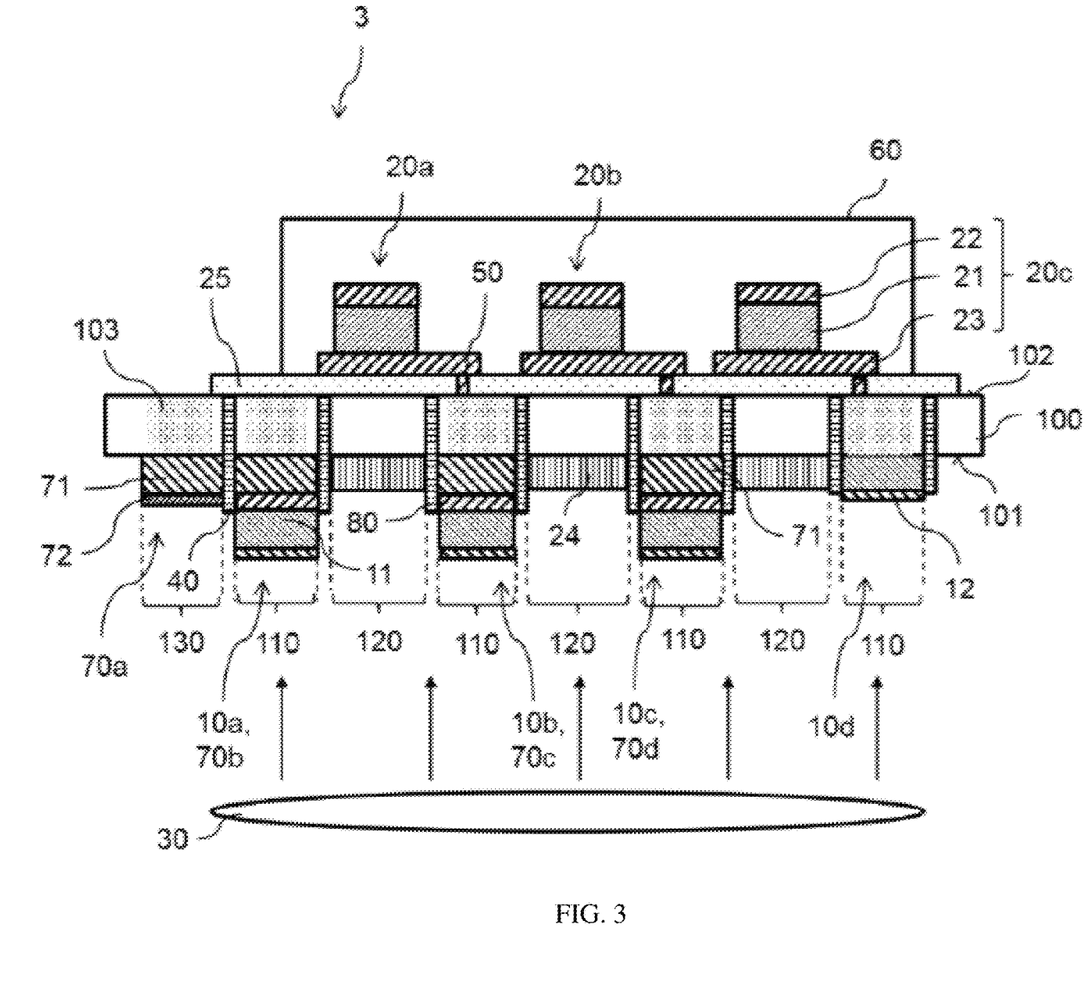

FIG. 3 shows a third embodiment 3 of the multispectral device which, in addition to the first and second functional elements 10a to 10d and 20a to 20c, contains third functional elements 70a to 70d. The third functional elements 70a to 70d are each formed on the side of the multispectral device 3 containing the first surface 101 and are arranged either in the first lateral regions 110 on the side of the first functional elements 10a to 10c facing away from the incident light, as shown for the third functional elements 70b to 70d, or in third lateral regions 130, as shown for the third functional element 70a. Thus, the second lateral regions 120 remain unchanged from previous embodiments 1 and 2. The third functional elements 70a to 70d comprise a third functional layer 71 capable of detecting light in a third wavelength range λ3, the third wavelength range λ3 being different from the first and second wavelength ranges λ1 and λ2. In the third functional elements 70b to 70d, light is evaluated which has already passed through the first functional layer 11 of the first functional element 10a to 10c. An electrode 80 or another intermediate layer can be arranged between the first functional layer 11 and the third functional layer 71. However, this is not obligatory. In the third lateral region 130, an optical functional layer, for example a second DBR layer 72, which may be different from the first DBR layer 12, is arranged. Furthermore, an integrated active component 103 may also be formed in the substrate 100 in the third region.

However, a third functional element can also be arranged on the second surface 102 of the substrate 100 in a first lateral region 100 or a third lateral region 130. In this case, however, the substrate 100 is to be made transparent in this region at least for light in the third wavelength range 103, which means that, for example, no integrated active component 103 may be present in this lateral region.

Figure 4A:
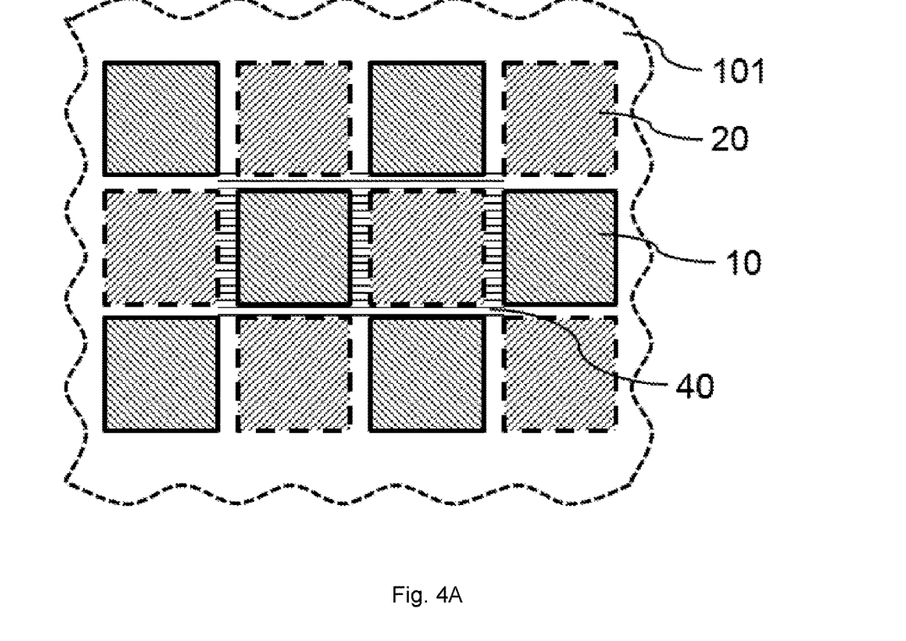
Figure 4B:
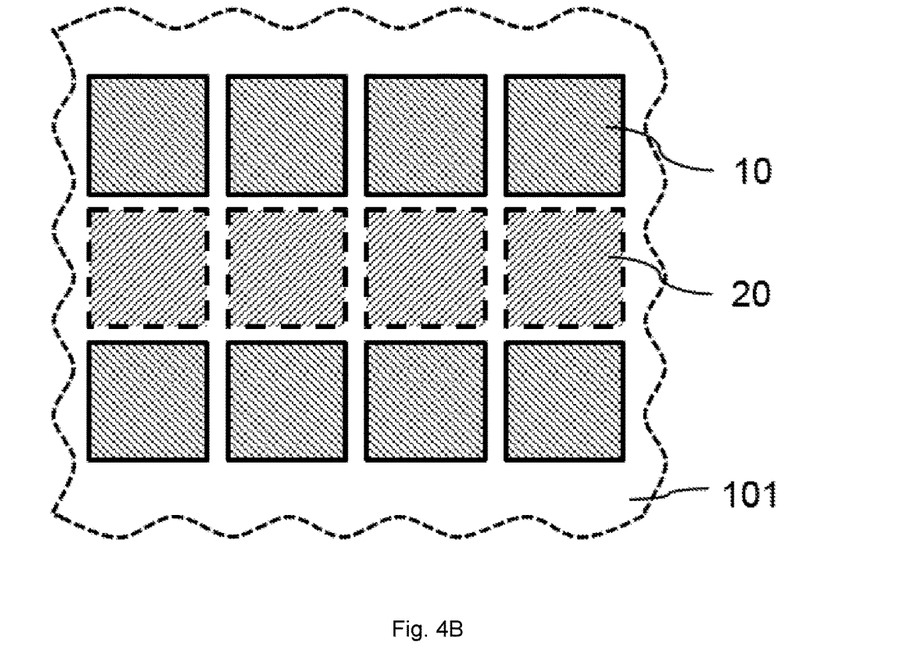
Figure 4C:
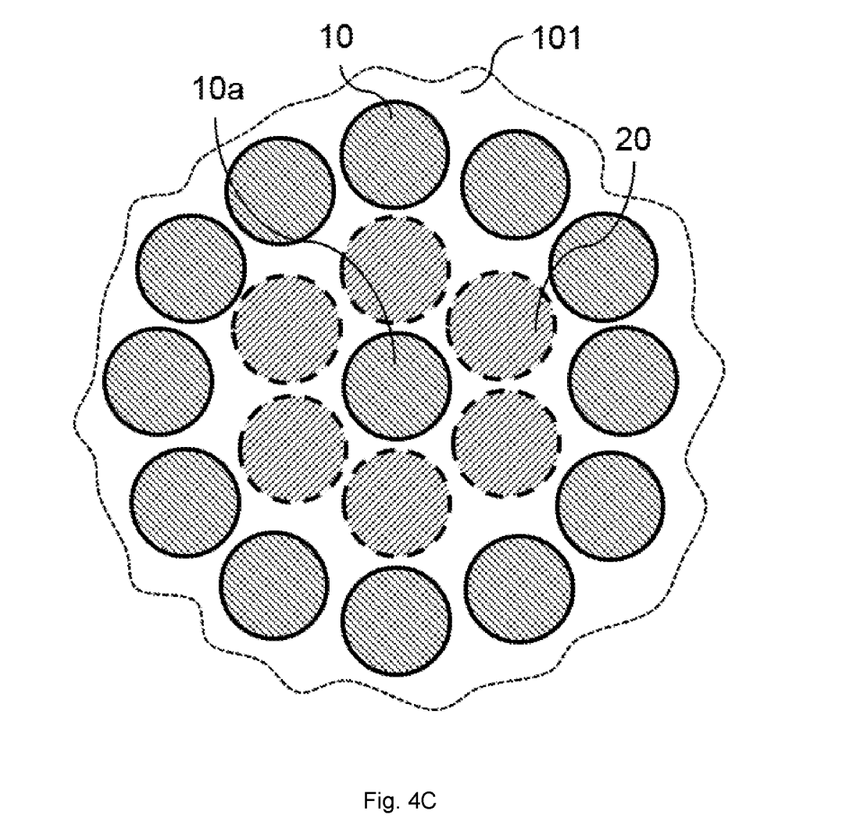

FIGS. 4A to 4C show by way of example three different arrangements of the first and second functional elements 10 and 20, respectively, in plan views of the first surface 101 of the substrate. Since the second functional elements 20 may not be visually visible if the substrate is not transparent in the visible light range, as they are arranged on the second surface of the substrate, the second functional elements 20 are only shown with a dashed contour. Possible filter layers arranged on the first functional elements 10 or the second functional elements 20 are not shown in these illustrations to increase clarity. However, for the central first and second functional elements 10 and 20 in FIG. 4A, the aperture layer 40, which surrounds the first functional elements 10 and encloses the second lateral regions in which the second functional elements 20 are formed, is shown in part.

FIG. 4A shows a grid-like arrangement of the first and second functional elements 10 and 20, in which first and second functional elements 10 and 20 alternate in each row and in each column.

In contrast, FIG. 4B shows a line-like arrangement in which only first functional elements 10 or only second functional elements 20 are arranged in each line, with different functional elements being formed in adjacent lines.

FIG. 4C shows a concentric arrangement of the functional elements, with second functional elements 20 in a first circle around a central first functional element 10a and first functional elements 10 again in a second circle. Both circles have the same center, with the second circle having a larger radius than the first circle.

In FIGS. 4A and 4B, functional elements 10 and 20, respectively, are shown with a square contour, whereas the functional elements 10 and 20, respectively, in FIG. 4C have a circular contour. However, these are only examples. Other possible contours include: oval, elliptical, elongated hole, triangular, other 4-cornered shapes, polygonal shapes, each of which may be regular or irregular. Furthermore, different first and/or second functional elements may also have different contours. Similarly, the sizes of the functional elements may differ from each other. Typically, a functional element has an area in the range of 5 μm$^2$ to 100 mm$^2$.

FIGS. 1 to 3 show embodiments of the multispectral device according to the invention, in which all functional elements are designed as detecting elements. FIGS. 5A to 5D now schematically illustrate all variants of the design of the first and second functional elements that are possible in principle. The arrows indicate the direction of the light, i.e., whether it is incident on or emitted from a functional element. Of course, further designs are possible, e.g., by combining detecting first functional elements and emitting first functional elements with detecting second functional elements or different designs of the third functional elements.

Figure 5A:
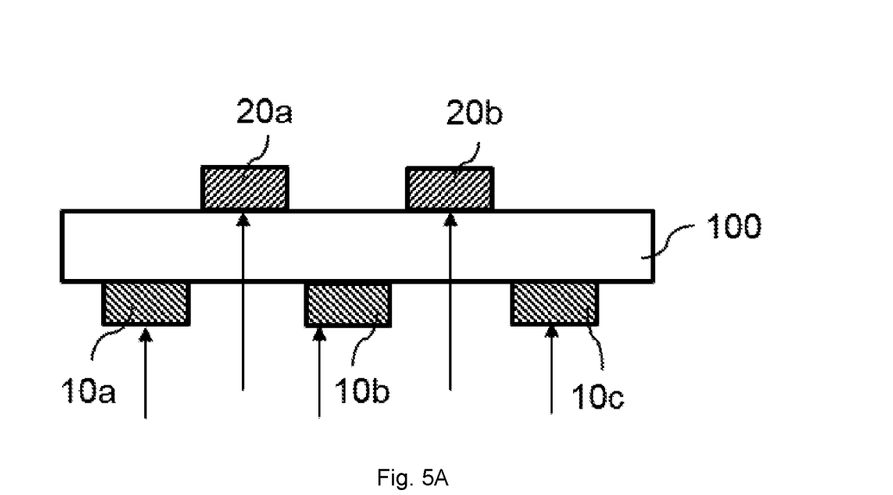

FIG. 5A schematically illustrates the embodiments of FIGS. 1 to 3 in which both the first functional elements 10a to 10c and the second functional elements 20a and 20b are detecting elements.

Figure 5B:
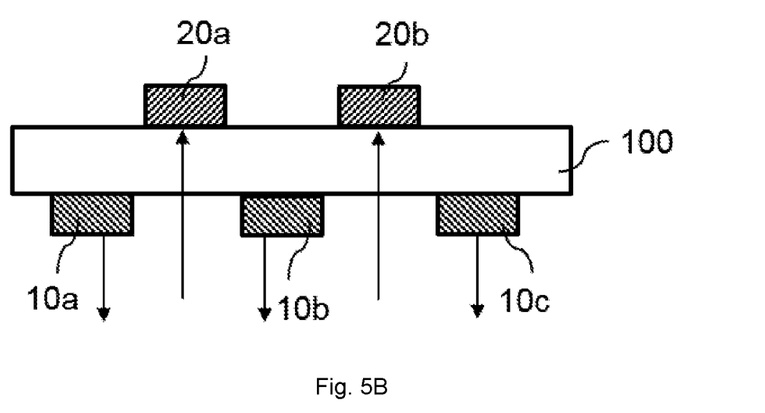

In the case shown in FIG. 5B, the first functional elements 10a to 10c are light emitting elements, while the second functional elements 20a and 20b are light detecting elements.

Figure 5C:
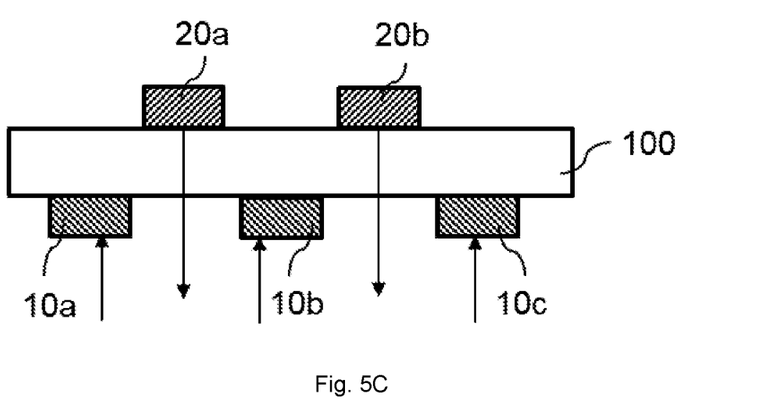

The configuration of the first functional elements 10a to 10c as light detecting elements and the second functional elements 20a and 20b as light emitting elements is shown in FIG. 5C.

Figure 5D:
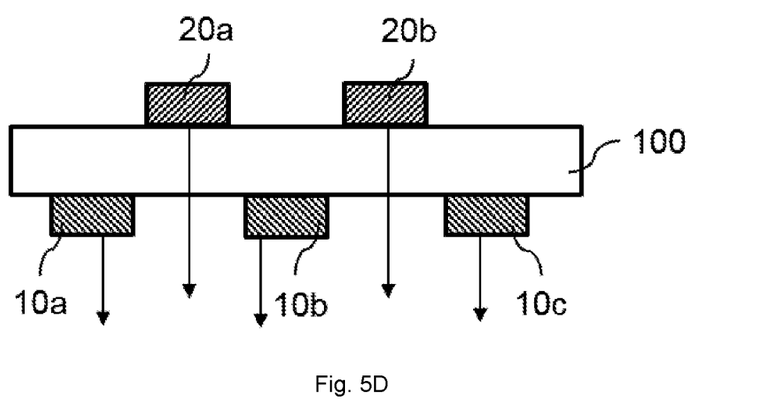

Finally, FIG. 5D shows an embodiment in which both the first functional elements 10a to 10c and the second functional elements 20a and 20b are designed as light-emitting elements.

REFERENCES

1 The multispectral device according to a first embodiment
2 The multispectral device according to a second embodiment
3 The multispectral device according to a third embodiment
10, 10a-10d First functional element
11 First functional layer
12 First DBR layer
20, 20a-20c Second functional element
21 Second functional layer
22, 23 Electrode
24, 24' First filter layer
25, 25' Second filter layer
30 Light source
40 Aperture layer
50 Contact
60 Housing
70a-70d Third functional element
71 Third functional layer
72 Second DBR layer
80 Electrode
100, 100' Substrate
101 First surface of the substrate
102 Second surface of the substrate
103 Integrated active device
104 Semiconductor substrate
105 Glass substrate
110 First lateral region
120 Second lateral region
130 Third lateral region

The invention claimed is:
1. A hybrid multispectral device, comprising:
a substrate having a first surface and a second surface, wherein the second surface faces away from the first surface, said substrate being a composite substrate and comprising multiple layers;
at least one first functional element having a first functional layer operable to detect or emit light of a first wavelength range, wherein the at least one first functional element is arranged on the first surface of the substrate,
at least one second functional element having a second functional layer operable to detect or emit light of a second wavelength range different from the first wavelength range, wherein the at least one second functional element is arranged on the second surface of the substrate, wherein the at least one first functional element is arranged in at least one first lateral region of the multispectral device, and the at least one second functional element is arranged in at least one second lateral region of the multispectral device, wherein the at least one first lateral region and the at least one second lateral region are arranged laterally offset from each other in such a manner that the light of the second wavelength range reaches the at least one second functional element or that the light of the second wavelength range emitted by the at least one second functional element exits the multispectral device on the first surface of the substrate without having passed through the first functional layer, and wherein the substrate comprises a semiconductor substrate on which the at least one first functional element is formed and a glass substrate or a plastic substrate on which the at least one second functional element is formed, and the semiconductor substrate and the glass or plastic substrate are bonded to each other by means of a bonding layer, an adhesive layer or another interconnecting layer.

2. The hybrid multispectral device according to claim 1, wherein at least one optical filter layer is arranged on the first surface and/or the second surface of the substrate in the at least one second lateral region.

3. The hybrid multispectral device according to claim 1, wherein the at least one second lateral region on the side of the first surface is surrounded by an optical aperture layer.

4. The hybrid multispectral device according to claim 1, wherein a further layer is arranged on the first functional layer on the side facing away from the first surface of the substrate, which layer serves as an optical filter or as a mirror or as a DBR.

5. The hybrid multispectral device according to claim 1, wherein the substrate comprises active integrated devices or circuit elements but arranged outside the at least one second lateral region.

6. The hybrid multispectral device according to claim 1, wherein the substrate comprises a semiconductor layer.

7. The hybrid multispectral device according to claim 1, wherein the first functional layer comprises an inorganic layer.

8. The hybrid multispectral device according to claim 1, wherein the second functional layer comprises an organic layer.

9. The hybrid multispectral device according to claim 1, wherein the multispectral device further comprises at least one third functional element comprising a third functional layer operable to detect or emit light of a third wavelength range different from the first and second wavelength ranges, wherein the at least one third functional element is arranged on the first surface of the substrate or on the second surface of the substrate in a lateral region different from the second lateral region.

10. The hybrid multispectral device according to claim 9, wherein the third functional element is arranged in the at least one first lateral region in such a manner that the light of the third wavelength range reaches the at least one third functional element or that the light of the third wavelength range emitted from the at least one third functional element exits the multispectral device on the first surface of the substrate after having passed through the first functional layer, wherein the first functional layer is transparent to light of the third wavelength range.

11. The hybrid multispectral device according to claim 1, wherein at least the first functional element or the second functional element is operable to detect light and is present in a number greater than 1 in the multispectral device.

12. The hybrid multispectral device according to claim 11, wherein different first functional elements operable to detect light and/or different second functional elements operable to detect light are operable to detect light having wavelengths different from each other in the first and second wavelength ranges, respectively.

13. The hybrid multispectral device according to claim 1, wherein the multispectral device further comprises a plurality of first lateral regions and a plurality of second lateral regions, and the first lateral regions and the second lateral regions are arranged in a grid-like, line-like or concentrically distributed manner.

* * * * *